United States Patent
Lee et al.

(10) Patent No.: US 8,334,691 B2
(45) Date of Patent: Dec. 18, 2012

(54) ULTRA FAST MAGNETIC RESONANCE IMAGING METHOD AND APPARATUS FOR NON-CONTRAST AGENT MR ANGIOGRAPHY USING ELECTROCARDIOGRAPH OR PULSE TRIGGERED HALF FOURIER TURBO SPIN ECHO-BASED ACQUISITION WITH VARIABLE FLIP ANGLE EVOLUTION AND HIGH RESOLUTION

(75) Inventors: Vivian S. Lee, New York, NY (US); Jian Xu, New Hyde Park, NY (US)

(73) Assignees: Siemens Medical Solutions USA, Inc., Malvern, PA (US); New York University, New York, NY (US)

(*) Notice: Subject to any disclaimer, the term of this patent is extended or adjusted under 35 U.S.C. 154(b) by 562 days.

(21) Appl. No.: 12/622,061

(22) Filed: Nov. 19, 2009

(65) Prior Publication Data
US 2011/0115484 A1    May 19, 2011

(51) Int. Cl.
*G01V 3/00*    (2006.01)
(52) U.S. Cl. .......................... 324/306; 324/309
(58) Field of Classification Search ............ 324/306, 324/307, 309
See application file for complete search history.

(56) References Cited

U.S. PATENT DOCUMENTS

| | | | | |
|---|---|---|---|---|
| 4,739,766 A | * | 4/1988 | Riederer | 600/413 |
| 4,777,957 A | * | 10/1988 | Wehrli et al. | 600/413 |
| 6,144,201 A | | 11/2000 | Miyazaki | |
| 6,801,800 B2 | | 10/2004 | Miyazaki et al. | |
| 7,047,060 B1 | * | 5/2006 | Wu | 600/410 |
| 8,188,735 B2 | * | 5/2012 | Derakhshan et al. | 324/307 |

OTHER PUBLICATIONS

MR Angiography in the Evaluation of Atherosclerotic Peripheral Vascular Disease[1]—Radiology Feb. 2000—pp. 325-338.
Non-Contrast-Enhanced MR Angiography Using 3D ECG-Synchronized Half-Fourier Fast Spin Echo—2000 Journal of Magnetic Resonance Imaging—Miyazaki et al pp. 776-783.

(Continued)

*Primary Examiner* — Louis Arana
(74) *Attorney, Agent, or Firm* — Schiff Hardin LLP

(57) ABSTRACT

In a magnetic resonance imaging method for non-contrast imaging of blood at a region in the subject's body, a first 3D MR image is acquired represented by a first 3D volume data set of the region at a first trigger delay time. The first 3D image is acquired using a substantially 90° excitation pulse followed by a plurality of variable flip angle refocus pulses forming an echo train where the refocus pulses are smaller than or equal to 180°. To form the first 3D MR image, multiple MR slices are acquired related to the first trigger delay time to speed up the acquisition of the first image. A second 3D MR image is acquired represented by a second 3D volume data set at the same region using the same steps for acquiring the first 3D MR image except that a second trigger delay time is used which is different than the first trigger delay time. The first 3D volume data set and the second 3D volume data set are subtracted to create a third 3D volume data set. From the third 3D volume data set a 2D substantially maximum intensity projection data set is created which may then be displayed to show the blood at the region.

19 Claims, 3 Drawing Sheets

OTHER PUBLICATIONS

Practical Implementation of Optimized Tissue-Specific Prescribed Signal Evolutions for Improved Turbo-Spin-Echo Imaging—Mugler et al—Proc. Intl. Soc. Mag. Reson. Med. 11(2003).

Peripheral MR Angiography: Separation of Arteries from Veins with Flow-spoiled Gradient Pulses in Electrocardiography-triggered Three-dimensional Half-Fourier Fast Spin-Echo Imaging[1]—Radiology Jun. 2003—pp. 890-896.

ISMRM Abstract Published 2005—Radiology 2003.

Reduced Acquisition Window with Parallel Technique Improves Non-Contrast 3D HAST MRA Imaging—Proc. Intl. Soc. Mag. Reson. Med—p. 1931-2006.

* cited by examiner

ULTRA FAST MAGNETIC RESONANCE IMAGING METHOD AND APPARATUS FOR NON-CONTRAST AGENT MR ANGIOGRAPHY USING ELECTROCARDIOGRAPH OR PULSE TRIGGERED HALF FOURIER TURBO SPIN ECHO-BASED ACQUISITION WITH VARIABLE FLIP ANGLE EVOLUTION AND HIGH RESOLUTION

RELATED APPLICATION

The present application is based on and claims the benefit of the filing date of a Provisional Application titled: Ultra Fast Magnetic Resonance Imaging Method and Apparatus For Non-Contrast Agent MR Angiography Using Electrocardiograph or Pulse Triggered Half Fourier Turbo Spin Echo Based Acquisition With Variable Flip Angle Evolution And High Resolution, U.S. Ser. No. 61/140,462 filed Dec. 23, 2008, inventors Vivian S. Lee and Jian Xu.

BACKGROUND

The disclosure relates to an imaging method and apparatus for non-contrast agent MR angiography.

In Miyazaki U.S. Pat. No. 6,144,201, a prior art technique for MR imaging utilizing an ECG gating technique is described.

In Miyazaki U.S. Pat. No. 6,801,800, a prior art technique for MR imaging using ECG-prep scan is described.

In two Toshiba prior art documents (hereinafter "Toshiba prior art"), non-contrast-enhanced MR angiography is described—"Non-Contrast-Enhanced MR Angiography Using 3D ECG-Synchronized Half-Fourier Fast Spin Echo", Journal of Magnetic Resonance Imaging 12:776-783 (2000) Miyazaki et al; and Peripheral MR Angiography is described—"Peripheral MR Angiography: Separation of Arteries from Veins with Flow-spoiled Gradient Pulses in Electrocardiography—Triggered three-dimensional Half-Fourier Fast Spin—Echo Imaging", Radiology 2003, 227 p. 890-896, Miyazaki et al.

SUMMARY

In a magnetic resonance imaging method for non-contrast imaging of blood at a region in the subject's body, a first 3D MR image is acquired represented by a first 3D volume data set of the region at a first trigger delay time. The first 3D image is acquired using a substantially 90° excitation pulse followed by a plurality of variable flip angle refocus pulses forming an echo train where the refocus pulses are smaller than or equal to 180°. To form the first 3D MR image, multiple MR slices are acquired related to the first trigger delay time to speed up the acquisition of the first image. A second 3D MR image is acquired represented by a second 3D volume data set at the same region using the same steps for acquiring the first 3D MR image except that a second trigger delay time is used which is different than the first trigger delay time. The first 3D volume data set and the second 3D volume data set are subtracted to create a third 3D volume data set. From the third 3D volume data set a 2D substantially maximum intensity projection data set is created which may then be displayed to show the blood at the region.

DESCRIPTION OF THE PREFERRED EMBODIMENT

Figure 1:
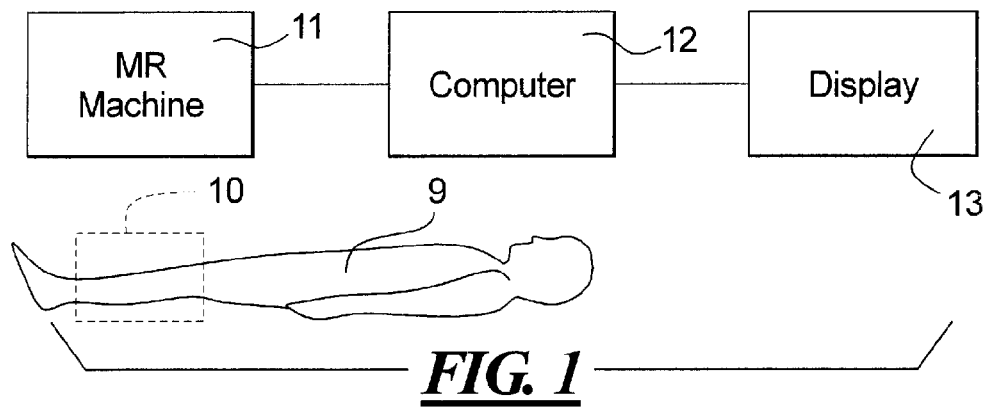
FIG. 1 shows a block diagram of a system used in the preferred embodiment.

For the purposes of promoting an understanding of the principles of the invention, reference will now be made to the preferred embodiment/best mode illustrated in the drawings and specific language will be used to describe the same. It will nevertheless be understood that no limitation of the scope of the invention is thereby intended, and such alterations and further modifications in the illustrated device and such further applications of the principles of the invention as illustrated as would normally occur to one skilled in the art to which the invention relates are included.

According to the preferred embodiment, a method and apparatus is disclosed for a new ultra fast magnetic resonance imaging for non-contrast agent Magnetic Resonance Angiography (MRA) using electrocardiogram (ECG) or pulse-triggered half Fourier turbo spin echo based acquisition with variable flip angle evolution and high resolution. The new ultra fast magnetic resonance imaging method and apparatus for non contrast agent MR angiography using ECG or pulse triggered half Fourier turbo spin echo based acquisition with variable flip angle distribution and high isotropic resolution provides sharper MR angiography without any contrast agent in a short time and with low SAR (Specific Absorption Rate) on high field systems.

The method explicitly provides a way to shorten image acquisition and/or increase spatial resolution for widely-used spin-echo train magnetic resonance angiography techniques, and enables high-field imaging within the safety guidelines established by the Food and Drug Administration for power deposition in human MRI or MRA. The prep scans are used to set optimum cardiac phase and best spoil gradient in slice selective, phase encoding, and readout directions in both systole and diastole phases of the heart. Then two or more scans are started to acquire the data during the early systole and mid-systole or diastole phase using ECG or pulse triggering. The early systole phase images (with trigger delay=0 ms or a little more) are employed as the mask image (which has the highest signal intensity during the whole cardiac cycle), and, using the subtraction of the mask image by one or more cardiac phase images, the artery/vein visually separated blood images are produced.

In FIG. 1 a system for performing the method of the preferred embodiment is illustrated. An MR machine 11 is provided which obtains images from a region 10 of interest such as a leg, of a subject 9. Images from the MR machine 11 are input to computer 12, and a display 13 displays images according to the preferred embodiment.

Figure 2:
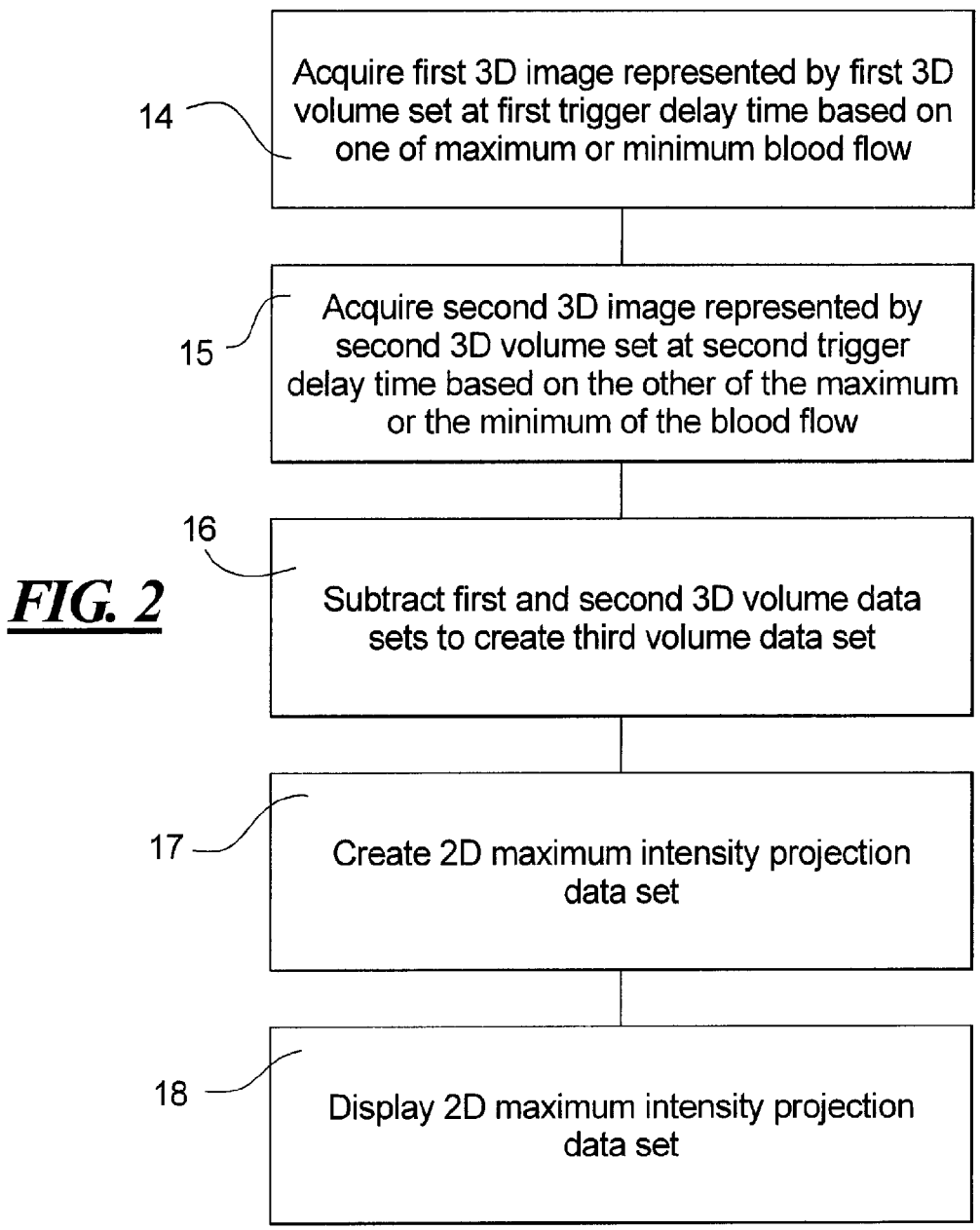
FIG. 2 is a flow chart showing a method according to the preferred embodiment.

FIG. 2 illustrates a flow chart of the method of the preferred embodiment performed by the system shown in FIG. 1. At step 14, a first 3D MR image of region 10 of subject 9 is acquired by the MR machine 11 and represented by a first 3D volume data set at a first trigger delay time based on one of a maximum or a minimum blood flow at a first heart trigger event. To acquire the first 3D image, a 90° excitation pulse is used followed by a plurality of variable flip angle refocus pulses forming an echo train where all of the refocus pulses are smaller than or equal to 180°. This permits a lower specific absorption rate at region 10 in subject 9. The refocus pulses are non-selective to reduce echo spacing time between the refocus pulses. Multiple MR slice images of the region 10 are acquired for the first heart trigger event to speed up the acquisition of the first image.

At step 15, a second 3D MR image is acquired represented by a second 3D volume data set in the same region 10 using the same steps for acquiring the first 3D MR image except a second trigger delay time based on the other of the maximum or the minimum blood flow at a second heart trigger event is used, which is different than the first trigger delay time.

As shown at step 16, the first 3D volume data set is subtracted from the second 3D volume data set, or the second 3D volume data set is subtracted from the first 3D volume data set, to create a third 3D volume data set.

With the computer 12, from the third 3D volume data set a 2D maximum intensity projection data set is created.

At step 18, the 2D maximum intensity projection data set is displayed on a display screen 13 to show the blood at the region.

Figure 3:
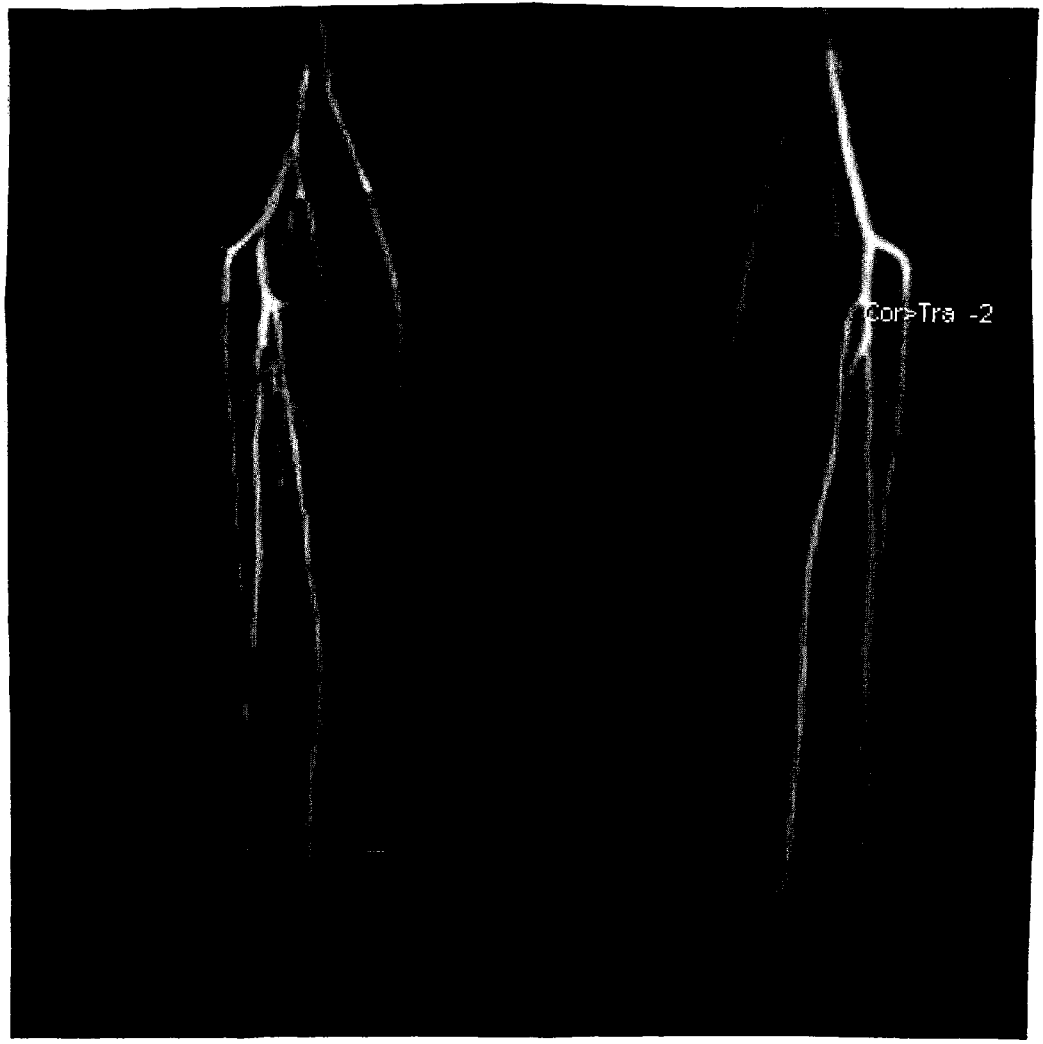
FIG. 3 shows a MIP (Maximal Intensity Projection) of subtracted images using the technique of the preferred embodiment.

FIG. 3 shows the MIP (Maximal Imaging Projection) of subtracted images using the technique of FIG. 2. The parameters are: FOV (Field of Vision) 500×500, BW (Bandwidth) 975 Hz/pixel, ECG triggered. Two 3D measurements, with TD (Time Delay)=0 ms and TD=300 ms, Matrix 256×75%, IPAT (Integrated Parallel Acquisition Technique) factor=3, slice turbo factor=2, total acquisition time is 1:03 min.

Figure 4:
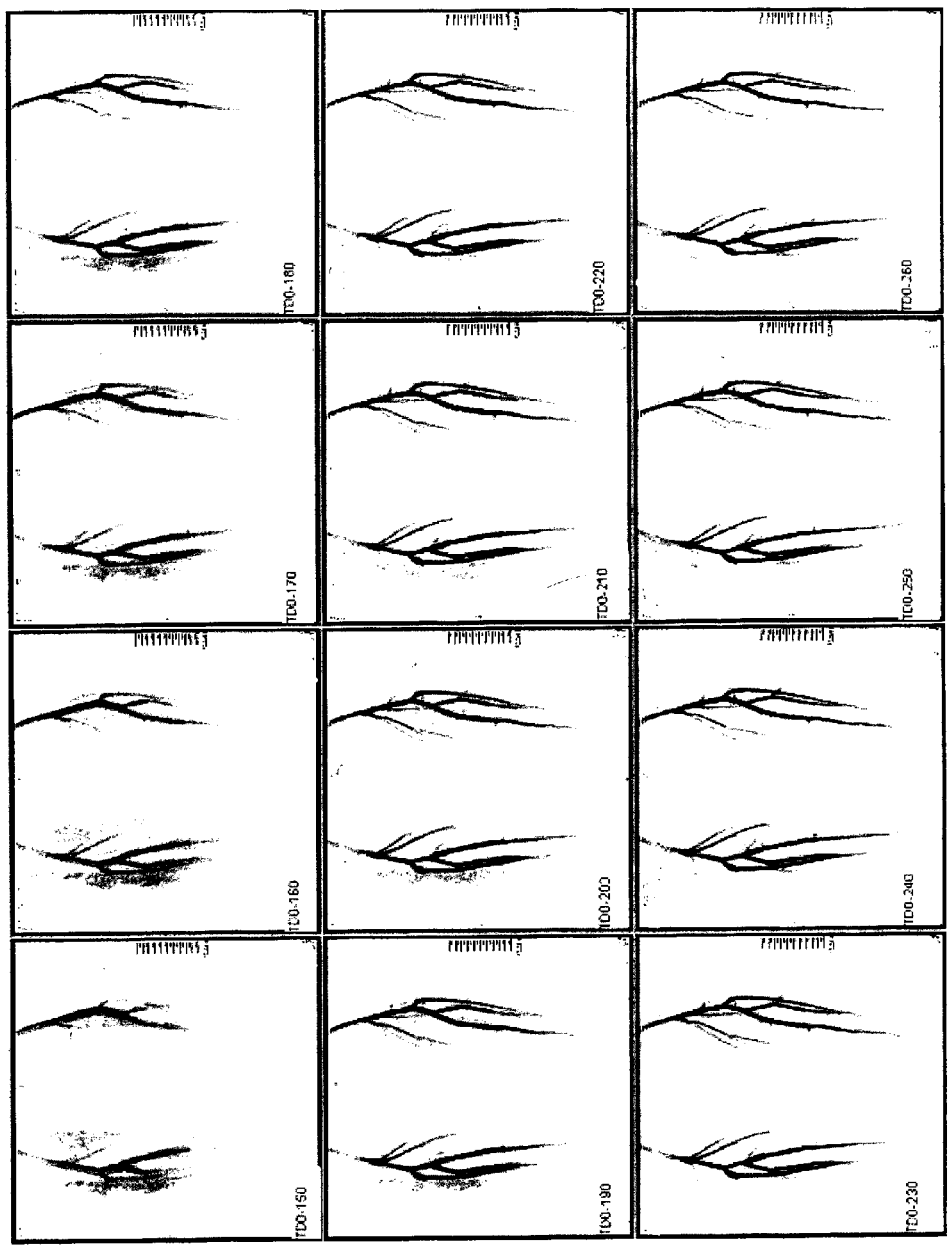
FIG. 4 shows a non-contrast agent time resolved MRA (Magnetic Resonance Angiography) from a subject.

FIG. 4 shows the non-contrast agent time resolved MRA from a subject, the parameters are: FOV 500×500, BW 975 Hz/pixel, ECG triggered, 13 3D measurements, with TD=0 ms and TD=150 ms, 160 ms . . . 260 ms, matrix 256×75%, iPAT factor=3, slice turbo factor=2, Acquisition time per each measurement is around 35 s, Total acquisition time is 8 minutes.

In contrast to the conventional Turbo Spin Echo (TSE) sequence with constant flip angle refocusing pulses (for instance 180°), the refocusing pulse train of the present embodiment comprises variable flip angles pulses (<180°) along the echo train→low SAR as in Miyazaki's U.S. Pat. Nos. 6,144,201 and 6,801,800. 90° is used as the excitation RF pulse and 180° as the refocus RF pulse.

To accelerate the acquisition, one or multi shots (trigger pulses) (use large echo train) in a phase encoding direction are used. This achieves a higher sampling efficiency.

The method is preferably performed with a parallel acquisition technique in one or two dimensions. This speeds up and reduces the acquisition window.

The method is preferably performed with one or more partitions per shot (trigger pulse) (slice turbo factor). With a higher slice turbo factor the acquisition is speeded up. This is a difference with respect to the previously mentioned Toshiba prior art.

Non-selective excitation is preferably used in the method. This is another difference with respect to the aforementioned Toshiba prior art.

Non-selective refocus pulses (<180°) are used in the method to reduce the echo spacing time by 2-4 ms. This is another difference with respect to the aforementioned Toshiba prior art.

In the method, by rotating the orientation from coronal to sagittal, this allows use of two slabs excitation at the same time, especially for the femoral or calf imaging, and a large rectangle FOV can be used, which can reduce the acquisition window dramatically. This is another difference with respect to the aforementioned Toshiba prior art.

The method uses sagittal orientation and applies one slab at the right leg, and another at the left leg, triggered by an interleaved RR waveform. In general, one slab per ECG or pulse trigger is employed. This is another big difference with respect to the aforementioned Toshiba prior art.

The method applies a trigger delay scout for a different slab (different leg) to find the best trigger delay time for the systolic and the diastolic phase for different legs (assume that some patients have different systolic and diastolic phase for different legs). This is another difference with respect to the aforementioned Toshiba prior art.

With the method a scout of spoil gradient in the readout direction is applied for a different slab (different leg) in the best systolic and diastolic phase is used to find the best readout spoil gradient for different legs (assume that some patients have different blood velocity in different legs). In Miyazaki U.S. Pat. Nos. 6,144,201 and 6,801,800 she used one slab and coronary orientation.

With the method, a different spoil gradient pulse in the phase encoding direction is used for enhancing differences in a flow void effect depending on blood flow velocity for a different slab (different leg) in the best systolic and diastolic phase which enables slow-speed flows to be depicted without fail (to find the best phase encoding spoil gradient for a different leg). This is another big difference with respect to the aforementioned Toshiba prior art.

The method applies a spoil gradient in the slice selection direction for different slab (different leg) in the best systolic and diastolic phase to find the best slice selection spoil gradient for the different leg. This is another big difference with respect to the aforementioned Toshiba prior art.

The method applies a zero order or a higher order flow compensation in three dimensions for the early systole or later diastolic phase imaging to get the brightest blood image.

The method uses the ability to control the phase (and thus signal intensity) of moving blood by gating the acquisition at different cardiac phases (maximal motion-induced signal loss at systole and minimum motion-induced signal loss at diastole). Thus the subtraction image will contain arteries only, because venous spins have relatively constant velocity (and thus signal) throughout the cardiac cycle and will subtract out. Here, it is assumed that the early systole is with TD (Trigger Delay time)=0 ms or a little more has the most highest Signal Intensity. Therefore the mask image will be subtracted by other systolic or diastolic images (note the later diastolic images have the highest signal intensity like Miyazaki U.S. Pat. Nos. 6,144,201 and 6,801,800).

While these prior patents of Miyazaki (U.S. Pat. Nos. 6,144,201 and 6,801,800) use later diastolic images for highest arterial signal intensity, the instant method, because of its shorter duration, can be performed during early systole with trigger delay time of 0 msec to produce high signal intensity in the arteries. The mask image will be produced by subtracting the systolic images from the diastolic images.

The method uses half Fourier acquisition or partial Fourier and zero filling in the phase encoding direction to reduce the acquisition window and reduce the T2* decay effect.

A non-contrast agent time resolved approach is used in the method with multiple different trigger delay times, which use the early systole TD=0 ms or a little more as the mask image, and subtract all the other systolic and diastolic phase images. This is a big improvement over Miyazaki U.S. Pat. Nos. 6,144,201 and 6,801,800 where they always use the later diastolic phase images as the mask image, which is not good, since the early systolic phase image has the highest signal intensity.

The early systole image acts as the mask image in the present method. A prior art method of Toshiba cannot do this, because their turbo or fast spin echo based sequence has a large echo spacing time, therefore the acquisition window is huge with large echo train, which will cover the whole systolic phase, and even the diastolic phase.

By using the interleaved acquisitions in the present method for multi-phase measurements (short term acquisition mode), an unexpected motion of subjects can be minimized.

By using segment sharing or the keyhole technique in the present method, the total acquisition time for multi-phase or time resolved can be substantially saved.

By using automatic RR waveform detection, the arrhythmia rejection feature makes the present method available for some irregular heart beat subjects.

The method has the following advantages. The variation of the turbo spin echo with variable flip angle evolution technique with ECG or pulse triggering can reduce the SAR issue on high fields dramatically, and the non-selective RF refocus and the selective or non-selective RF excitation can shorten the echo spacing time to 2-3 ms, which gives less T2 decay blurring as well as better capturing of the desired period of systolic and diastolic flow as compared to conventional 3D TSE (Turbo Spin Echo) or HASTE (Half Fourier Acquisition Single-shot Turbo Spin Echo). The shortened acquisition window makes the technique available for fast heart beat cases (which have short RR waveforms).

Compared to contrast enhanced MRA, the total acquisition time could be shorter in the present method. This may not be good to some subjects with irregular heart beat.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

We claim as our invention:

1. An ultra fast magnetic resonance imaging method for non-contrast imaging of blood at a region in a subject's body, comprising the steps of:
    acquiring a first 3D MR image represented by a first 3D volume data set in a computer of said region at a first trigger delay time based on one of a substantially maximum or a substantially minimum blood flow at a first heart trigger event, and to acquire said first 3D image using a turbo spin echo acquisition comprising a substantially 90° excitation pulse followed by a plurality of variable flip angle refocus pulses forming an echo train where all of the refocus pulses are smaller than 180° so as to lower specific absorption rate at said region in the subject, said refocus pulses being non-selective to reduce echo spacing time between said refocus pulses, and to form said first 3D MR image acquiring multiple MR slice images of said region for said first heart trigger event to speed up said acquisition of the first image;
    acquiring a second 3D MR image represented by a second 3D volume data set in said computer at said same region using the same steps for acquiring said first 3D MR image except that a second trigger delay time based on the other of the substantially maximum or the substantially minimum blood flow at a second heart trigger event is used which is different than said first trigger delay time;
    with said computer subtracting the first 3D volume data set from the second 3D volume data set, or subtracting the second 3D volume data set from the first 3D volume data set, to create a third 3D volume data set in said computer;
    with said computer creating from the third 3D volume data set a 2D substantially maximum intensity projection data set; and
    displaying the 2D substantially maximum intensity projection data set on a display screen to show an image containing the blood at said region.

2. The method according to claim 1 wherein for speeding up said acquisition of said first and second images one or more multi-shots in a phase encoding direction are employed to achieve a higher sampling efficiency.

3. The method of claim 1 wherein for speeding up said acquisition of said first and second images employing a parallel acquisition technique in two dimensions.

4. The method of claim 1 wherein said region of said subject comprises a peripheral portion of the subject.

5. The method of claim 4 wherein said peripheral portion of said subject comprises a leg or an arm of the subject.

6. The method of claim 1 wherein an orientation of said slices is rotated from a coronal orientation to a sagittal orientation which allows using two slabs excitation at a same time with an enlarged rectangle field of view to speed up said acquisition of the first and second images.

7. The method according to claim 6 wherein said sagittal orientation is used to apply one of said two slabs at one leg of the subject and applying the other of said two slabs at another leg of the subject and triggering by an interleaved RR waveform of said respective first or second heart trigger event where said respective first or second heart trigger event can comprise either an electrocardiogram or a pulse trigger event.

8. The method according to claim 1 wherein said first or second trigger delay times are determined using ECG-gated phase contrast acquisitions before acquiring said first and second 3D MR images.

9. The method according to claim 1 wherein for determining said first or second trigger delay times acquiring a scout 3D MR image before acquiring said first and second 3D MR images using multiple trigger delay times to obtain a best trigger delay time for said first trigger delay time or said second trigger delay time.

10. The method of claim 1 wherein when acquiring said first and second 3D MR images applying a zero or higher order flow compensation in three dimensions for an early systole or later diastolic phase imaging to obtain a higher blood image in said region.

11. The method according to claim 1 wherein said second 3D MR image comprises a mask image, and wherein said mask image is acquired at an early systole phase of said second heart trigger event.

12. The method according to claim 1 wherein said first 3D MR image comprises a mask image; and wherein said mask image is acquired at an early systole phase of said first heart trigger event.

13. The method of claim 1 wherein said variable flip angle refocus pulses further increase a flow void effect in both said first and second heart trigger events.

14. An ultra fast magnetic resonance imaging system for non-contrast imaging of blood at a region in a subject's body, comprising the steps of:
    an MR machine which acquires a first 3D MR image represented by a first 3D volume data set, and a computer in which is stored said first 3D volume data set of said region at a first trigger delay time based on one of a substantially maximum or a substantially minimum blood flow at a first heart trigger event, and to acquire said first 3D image said MR machine using a turbo spin echo acquisition comprising a substantially 90° excitation pulse followed by a plurality of variable flip angle refocus pulses forming an echo train where all of the refocus pulses are smaller than 180° so as to lower specific absorption rate at said region in the subject, said refocus pulses being non-selective to reduce echo spacing time between said refocus pulses, and said MR machine, to form said first 3D MR image, acquiring multiple MR slice images of said region for said first heart trigger event to speed up said acquisition of the first image;

said MR machine also acquires a second 3D MR image represented by a second 3D volume data set stored in said computer at said same region using the same steps for acquiring said first 3D MR image except that a second trigger delay time based on the other of the substantially maximum or the substantially minimum blood flow at a second heart trigger event is used which is different than said first trigger delay time;

said computer subtracting the first 3D volume data set from the second 3D volume data set, or subtracting the second 3D volume data set from the first 3D volume data set, to create a third 3D volume data set in said computer;

said computer creating from the third 3D volume data set a 2D substantially maximum intensity projection data set; and a display screen which displays the 2D substantially maximum intensity projection data set to show an image containing the blood at said region.

15. A non-transitory computer-readable medium comprising a computer program for an ultra fast magnetic resonance imaging method for non-contrast imaging of blood at a region in a subject's body by use of an MR machine and a computer, said program performing the steps of:

storing in said computer a first 3D MR image acquired by said MR machine as a first 3D volume data set of said region at a first trigger delay time based on one of a substantially maximum or a substantially minimum blood flow at a first heart trigger event, and to acquire said first 3D image using a turbo spin echo acquisition comprising a substantially 90° excitation pulse followed by a plurality of variable flip angle refocus pulses forming an echo train where all of the refocus pulses are smaller than 180° so as to lower specific absorption rate at said region in the subject, said refocus pulses being non-selective to reduce echo spacing time between said refocus pulses, and to form said first 3D MR image acquiring multiple MR slice images of said region for said first heart trigger event to speed up said acquisition of the first image;

storing in said computer a second 3D MR image acquired with said MR machine as a second 3D volume data set at said same region using the same steps for acquiring said first 3D MR image except that a second trigger delay time based on the other of the substantially maximum or substantially minimum blood flow at a second heart trigger event is used which is different than said first trigger delay time;

subtracting the first 3D volume data set from the second 3D volume data set, or subtracting the second 3D volume data set from the first 3D volume data set, to create a third 3D volume data set; and creating from the third 3D volume data set a 2D substantially maximum intensity projection data set for use in displaying the 2D substantially maximum intensity projection data set to show an image containing the blood at said region.

16. A magnetic resonance imaging method for non-contrast imaging of blood at a region in a subject's body, comprising the steps of:

acquiring a first 3D MR image represented by a first 3D volume data set in a computer of said region at a first trigger delay time, and to acquire said first 3D image using a turbo spin echo acquisition comprising a substantially 90° excitation pulse followed by a plurality of variable flip angle refocus pulses forming an echo train where the refocus pulses are smaller than or equal to 180°, and to form said first 3D MR image acquiring multiple MR slice images of said region related to said first trigger delay time to speed up said acquisition of the first image;

acquiring a second 3D MR image represented by a second 3D volume data set in said computer at said same region using the same steps for acquiring said first 3D MR image except that a second trigger delay time is used which is different than said first trigger delay time;

with said computer subtracting the first 3D volume data set from the second 3D volume data set, or subtracting the second 3D volume data set from the first 3D volume data set, to create a third 3D volume data set in said computer;

with said computer creating from the third 3D volume data set a 2D substantially maximum intensity projection data set; and displaying the 2D substantially maximum intensity projection data set on a display screen to show an image containing the blood at said region.

17. The method of claim 16 wherein said first trigger delay time is based on one of a substantially maximum or a substantially minimum blood flow at a first heart trigger event and said second trigger delay time is based on the other of the substantially maximum or the substantially minimum blood flow at a second heart trigger event.

18. A magnetic resonance imaging system for non-contrast imaging of blood at a region in a subject's body, comprising the steps of:

an MR machine which acquires a first 3D MR image represented by a first 3D volume data set, and a computer in which is stored said first 3D volume data set of said region at a first trigger delay time, and to acquire said first 3D image said MR machine using a turbo spin echo acquisition comprising a substantially 90° excitation pulse followed by a plurality of variable flip angle refocus pulses forming an echo train where the refocus pulses are smaller than or equal to 180°, and said MR machine, to form said first 3D MR image, acquiring multiple MR slice images of said region related to said first trigger delay time to speed up said acquisition of the first image;

said MR machine also acquires a second 3D MR image represented by a second 3D volume data set stored in said computer at said same region using the same steps for acquiring said first 3D MR image except that a second trigger delay time is used which is different than said first trigger delay time;

said computer subtracting the first 3D volume data set from the second 3D volume data set, or subtracting the second 3D volume data set from the first 3D volume data set, to create a third 3D volume data set in said computer;

said computer creating from the third 3D volume data set a 2D substantially maximum intensity projection data set; and a display screen which displays the 2D substantially maximum intensity projection data set to show an image containing the blood at said region.

19. A non-transitory computer-readable medium comprising a computer program for a magnetic resonance imaging method for non-contrast imaging of blood at a region in a subject's body by use of an MR machine and a computer, said program performing the steps of:

storing in said computer a first 3D MR image acquired by said MR machine as a first 3D volume data set of said region at a first trigger delay time, and to acquire said first 3D image using a turbo spin echo acquisition comprising a substantially 90° excitation pulse followed by a plurality of variable flip angle refocus pulses forming an echo train where the refocus pulses are smaller than or equal to 180°, and to form said first 3D MR image acquiring multiple MR slice images of said region related to said first trigger delay time to speed up said acquisition of the first image;

storing in said computer a second 3D MR image acquired with said MR machine as a second 3D volume data set at said same region using the same steps for acquiring said first 3D MR image except that a second trigger delay time is used which is different than said first trigger delay time;

subtracting the first 3D volume data set from the second 3D volume data set, or subtracting the second 3D volume data set from the first 3D volume data set, to create a third 3D volume data set; and creating from the third 3D volume data set a 2D substantially maximum intensity projection data set for use in displaying the 2D substantially maximum intensity projection data set to show an image containing the blood at said region.

\* \* \* \* \*